United States Patent [19]

Hughes

[11] Patent Number: 4,973,857

[45] Date of Patent: Nov. 27, 1990

[54] CURRENT DIVIDER CIRCUIT

[75] Inventor: John B. Hughes, Hove, England

[73] Assignee: U.S. Philips Corporation, New York, N.Y.

[21] Appl. No.: 334,961

[22] Filed: Apr. 7, 1989

[30] Foreign Application Priority Data

Apr. 29, 1988 [GB] United Kingdom ................. 8810163

[51] Int. Cl.[5] ................................................ H03K 3/01

[52] U.S. Cl. .................................... 307/296.6; 307/32; 307/53; 323/315

[58] Field of Search .................... 307/32, 53, 270, 278, 307/296.8, 296.6; 323/315, 312, 316; 330/288

[56] References Cited

U.S. PATENT DOCUMENTS

| | | | |
|---|---|---|---|
| 4,243,948 | 1/1981 | Schade, Jr. | 330/289 |
| 4,339,729 | 7/1982 | Jason et al. | 330/294 |
| 4,618,816 | 10/1986 | Monticelli | 323/316 |
| 4,645,948 | 2/1987 | Morris et al. | 307/296 R |
| 4,673,830 | 6/1987 | Giorgetta et al. | 307/297 |
| 4,717,845 | 1/1988 | Dunn | 307/475 |

FOREIGN PATENT DOCUMENTS

| | | | |
|---|---|---|---|
| 0105508 | 5/1987 | Japan | 330/288 |
| 0219704 | 9/1987 | Japan | 330/288 |
| 2080649 | 1/1982 | United Kingdom | 330/288 |

*Primary Examiner*—Stanley D. Miller
*Assistant Examiner*—T. Cunningham
*Attorney, Agent, or Firm*—Bernard Franzblau

[57] ABSTRACT

A current divider circuit includes a node (22) which receives a signal current (I) and divides the signal current (I) between one or more first current paths formed by a first type of impedance element (T1' to TN') and one or more second current paths (28) formed by a type or types of impedance element (21, 22) dissimilar to the first type. Each second current path terminates in an output branch of a current mirror circuit (32). The input branch of each such current mirror circuit is connected to the node (22) via a further current path (30) formed by the first type of impedance element (T0'). The provision of the further current path(s) (30) and current mirror circuit(s) (32) ensures that a predetermined proportion of the total signal current can be made to flow into each current path, even though the second current path(s) (28) may contain arbitrary or unknown impedances. The circuit can also be used to control the voltage at the node (22) as well as dividing the received signal current.

12 Claims, 1 Drawing Sheet

CURRENT DIVIDER CIRCUIT

BACKGROUND OF THE INVENTION

This invention relates to a current divider circuit for receiving at a node a signal current and dividing the signal current in predetermined proportions between a plurality of current paths. The term signal current as used herein refers to any current whose purpose includes conveying information of some sort, in contradistinction, for example, to a mere supply current.

Current divider circuits as set forth in the opening paragraph are well known and are commonly used for generating scaled replicas of a reference current or other signal current in accordance with a desired weighting pattern. For example, in a digital-to-analog converter, several binary-weighted reference currents may be generated from a single master reference current. In the known circuits, each path usually comprises a transistor and the transistors of all the paths are designed to be identical or 'similar', meaning that the currents flowing through the different transistors are equal or are related in accordance with ratios defined by the relative geometries of the transistors. For example, the transistors may be bipolar (or MOS) types, with the emitter (or source) of each transistor connected to the input node and the base (or gate) of each transistor being connected to a common bias point. These circuits operate according to the well-known 'current-mirror' principle where each current path has a similar impedance.

A problem arises, however, when it is required to pass a predetermined portion of the current at the node through a current path which has an impedance dissimilar to those of the other paths, because in that case the current mirror principle will no longer operate to define the relative proportions of current flowing in the current paths except as between the paths of similar impedance.

SUMMARY OF THE INVENTION

It is an object of the invention to provide a circuit for dividing a signal current at a signal current node between a plurality of current paths in predetermined proportions in situations where the impedances of the paths are not all similar.

It is a further object of the invention to provide a circuit for controlling the voltage at a node and at the same time dividing a signal current received at the node in predetermined proportions between a plurality of current paths, even when the impedances of the paths are not all similar.

The invention provides a current divider circuit for receiving at a node a signal current and dividing the signal current in predetermined proportions between one or more first current paths formed by a first type of impedance element and one or more second current paths formed by a type or types of impedance element dissimilar to the first type, each second current path including an output branch of a current mirror circuit, the input branch of each such current mirror circuit being connected to the node via a further current path formed by the first type of impedance element. The first type impedance element can be any semiconductor element which can form a part of a current mirror circuit, e.g. bipolar or field effect transistors, whereas an impedance element dissimilar to the first type can be any other impedance element, including bipolar or field effect transistors of opposite polarity to the first type or of the same polarity, but having a different structure, e.g. to provide different breakdown potentials. The provision of the further current path(s) and current mirror circuit(s) ensures that a predetermined proportion of the signal current can be made to flow into each current path, even though the second current path(s) may contain arbitrary or unknown impedances. Each second current path may have its own separate further current path and current mirror circuit. This may be favourable if the proportions of the total current flowing in different second current paths differ widely. However, the current divider circuit may have a single further current path and a plurality of second current paths wherein the further current path is connected to the input branch of a current mirror circuit having a corresponding plurality of output branches. This is not only economical of components, but also reduces the additional load imposed by the further current path(s) on whatever is the source of the signal current.

The first current path(s) and the further current path(s) may comprise the main current paths of similar transistors having control electrodes connected to a common bias voltage so that relative geometries of the transistors define the said predetermined proportions. Such an embodiment can conveniently be formed by integration, whereby the transistors can be made to be accurately similar, since they are all produced by the same manufacturing process on the same semiconductor substrate.

Each similar transistor may be a metal-oxide-semiconductor field-effect transistor (MOSFET), the source-drain paths of the MOSFETs forming the paths of similar impedance, the source electrodes of the MOSFETs being connected to the node, the gate electrodes of the MOSFETs being connected to the common bias voltage, and the aspect ratios (W/L) of the similar MOSFETs defining the said predetermined proportions. The aspect ratio (W/L) of a field-effect transistor is the ratio of the width W of its channel to the length L of its channel, both being expressed in micrometers, for example. The geometry of the channels of MOS transistors can be scaled conveniently to give the desired ratios between the currents in the various paths, either by actually altering the length (L) and/or width (W) of the channel or simply by connecting a number of identical unit transistors in parallel (the effective aspect ratio of N identical transistors in parallel equals N times the aspect ratio of one such transistor). The latter approach avoids the problem that errors due to "end-effects" are different in different-sized transistors.

The invention further provides a circuit for controlling the voltage at a node while dividing a signal current flowing into the node in predetermined proportions between one or more first current paths including voltage control means and one or more second current paths including an impedance or impedances dissimilar to that of the voltage control means, the circuit comprising a current divider circuit as described in either of the last two preceding paragraphs, the common bias voltage forming a control signal for defining the voltage at the node. The voltage control means are formed by the similar transistors of the divider circuit. The circuit allows control of the voltage while simultaneously giving access to accurately defined portions of the signal current, which may be used, for example, for measuring the signal current or for passing through any desired impedance network, be it fixed, variable, inductive, capacitive or whatever. Depending on the source of the signal current, controlling the voltage at the node may, indirectly, also affect the signal current.

BRIEF DESCRIPTION OF THE DRAWING

Embodiments of the invention will now be described with reference to the accompanying drawings, in which.

DESCRIPTION OF THE PREFERRED EMBODIMENTS

Figure 1:
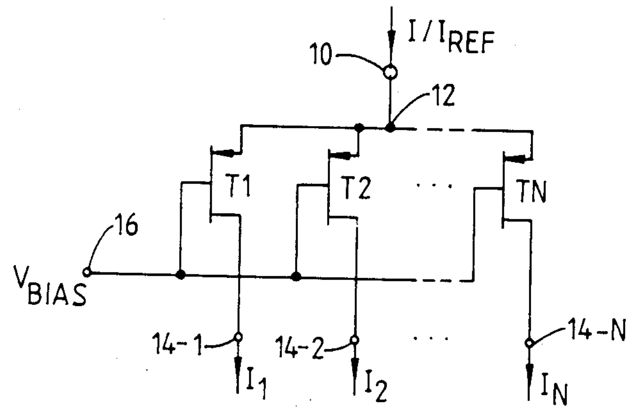
Fig.1 PRIOR ART
FIG. 1 shows a conventional current divider circuit.

FIG. 1 shows a conventional p-channel current mirror divider circuit which receives a current I via an input 10 which is connected to a node 12. The circuit divides the current I into a number N of smaller currents $I_1$ to $I_N$ flowing through N paths which include similar impedances and leave the circuit through respective outputs 14-1 to 14-N. In this context, "similar" impedances are to be taken to be impedances which are related so that if placed under identical bias conditions each will pass the same current, or a current related by a fixed ratio to the other currents.

Commonly, such similar impedances will be formed by active devices, integrated close to one another on a common substrate so as to be as closely matched as possible. In the circuit of FIG. 1 the currents $I_1$ to $I_N$ flow through respective p-channel MOS transistors T1 to TN. The sources of the transistors T1 to TN are all connected to the node 12 and the gates of the transistors T1 to TN are all connected to a bias input 16 so that the transistors T1 to TN all have the same gate-source voltage applied to them.

In operation, when the current I is fed into the input 10 from a source (not shown) and a suitable bias voltage $V_{BIAS}$ is applied to the bias input 16, the well-known current-mirror principle ensures that the division of the current I into the smaller currents $I_1$ to $I_N$ occurs in proportions predetermined by the relative geometries of the transistors T1 to TN. With the MOS transistors T1 to TN, the proportion of the total current $I_n$ flowing in each output 14-n will depend on the aspect ratios $(W/L)_1$ to $(W/L)_N$ of the transistors T1 to TN in accordance with the Formula (1) below.

$$I_n = I \cdot \frac{(W/L)_n}{(W/L)_1 + (W/L)_2 + \ldots (W/L)_N} \quad (1)$$

Such a circuit may be used, for example, in a digital-to-analog converter (DAC) to generate the required increments of output current from a master reference current $I=I_{REF}$. Thus, for a four-bit DAC, N=4 and the currents $I_1$ to $I_4$ may be defined in accordance with the formula above so that:

$$I_4=2.I_3=4.I_2=8.I_1 \text{ and}$$

$$I_1+I_2+I_3+I_4=I_{REF}=15.I_1.$$

The DAC will further comprise switching circuits so that each current $I_n$, which corresponds to a bit position in the digital input signal, can be added into the analog output signal or not, depending on the value of the corresponding bit in the actual input signal.

In some applications, however, it is desirable to be able to divide a current received at a node in predetermined proportions between a number of current paths whose impedances are defined by their circuit functions and cannot be made similar so as to form part of a current-mirror divider. This may be the case when the current received is not some master reference current generated solely for the purpose of generating a variety of smaller reference currents, but is a variable current defined by external parameters. It may be required that a portion of the current should flow through an inductor or capacitor, or some other device or network of devices. In such cases, the presence of the dissimilar impedance means that the current mirror principle no longer applies. Thus the formula (1) above, for example, could not be used if one of the similar transistors T1 to TN were to be replaced by a different kind of transistor, or by a completely different type of impedance altogether.

Figure 2:
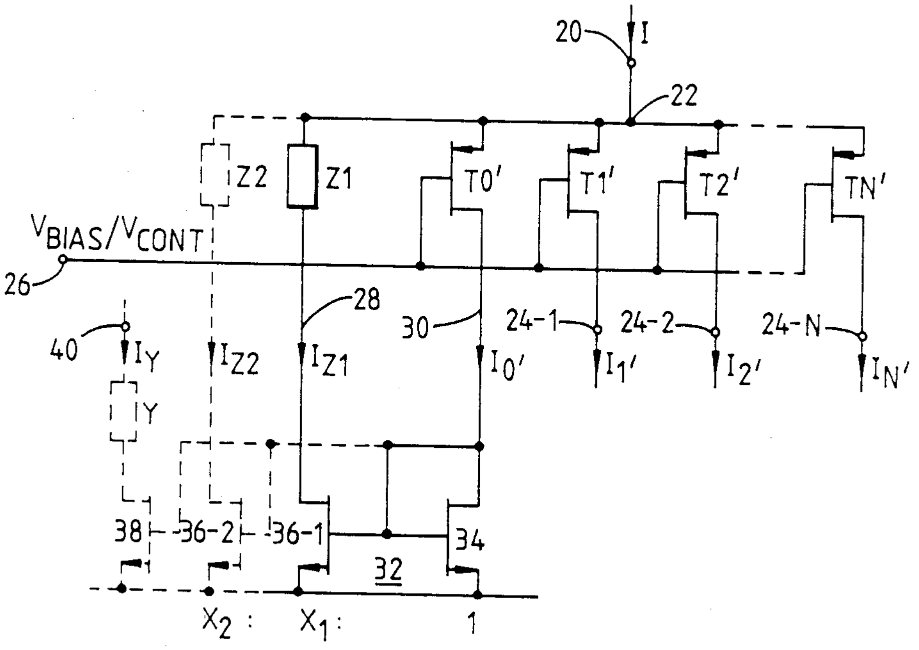
FIG. 2 shows a current divider circuit in accordance with the present invention.

FIG. 2 shows a current divider circuit in accordance with the present invention. In FIG. 2, the total current I enters the circuit via an input 20 which is connected to a node 22. Smaller currents $I_1'$ to $I_N'$ leave the node 22 to flow through N first current paths to N outputs 24-1 to 24-N, respectively. The first current paths are formed by N similar impedance elements which in this embodiment are similar p-channel MOS transistors T1' to TN' as in FIG. 1. The sources of the transistors T1' to TN' are connected to the node 22 and the gates of the transistors T1' to TN' are connected to a bias input 26 to which is applied a suitable bias voltage $V_{BIAS}$. Each transistor T1' to TN' has an associated aspect ratio $(W/L)_1'$ to $(W/L)_N'$.

A part $I_{Z1}$ of the current I arriving at node 22 flows through a second current path 28 which is formed by an impedance element Z1 which is not similar to the impedance elements formed by the transistors TI' to TN'. The element Z1 could be a MOSFET which is identical to the transistors T1' to TN' but which is supplied with different bias voltages; it could be a different type of transistor (for example, n-channel, bipolar or high-voltage); or it could be a diode, resistor, capacitor, inductor, thermistor or a totally unknown impedance network.

The division of current as between the N first current paths is governed by the current mirror principle in accordance with a formula similar to formula (1) above, but this does not hold for the division of the total current I because the impedance Z1 of the second current path is unrelated to those of the first current paths. In accordance with the invention, a further current path 30 is provided which is formed by an impedance element of the first type, namely a further p-channel transistor T0' similar to the transistors T1' to TN', the transistor T0' having its source connected to the node 22 and its gate connected to the bias input 26. The further current path 28 terminates in the output of a current mirror circuit 32 which has an n-channel input transistor 34 and an n-channel output transistor 36-1. The n-channel transistors 34 and 36-1 are similar, with geometries scaled so as to define a ratio $1:X_1$ between the input current $I_0$ flowing in the path 30 and the output current $I_{Z1}$ flowing in the path 28.

In operation, the further transistor T0' generates the current $I_0'$ in the path 30 in accordance with the current mirror principle so that the N+1 current $I_0'$ to $I_N'$ are related to one another by predetermined ratios corresponding to the aspect ratios $(W/L)_0'$ to $(W/L)_N'$ of the p-channel transistors T0' to TN'. The current mirror circuit 32 then ensures that the current $I_{Z1}$ in the current path 28, which flows through the arbitrary impedance Z1, is related to current $I_0'$ by a predetermined ratio $X_1$:1 and is therefore also related to all of the currents $I_1'$ to $I_N'$ as well. Thus, the division of the total current I between the various current paths is effected in predetermined proportions, even though one of the current paths has an impedance Z1 totally unrelated to the impedances of the other paths.

Formula (2) and Formula (3) below define the relationships between the currents in the circuit of FIG. 2. Formula (2) differs from Formula (1) in that it is necessary to take into account all of the currents flowing from the node 22, rather than just those flowing through the first current paths.

$$I_n' = I \cdot \frac{(W/L)_n'}{(1 + X_1) \cdot (W/L)_0' + (W/L)_1' + \ldots + (W/L)_N'} \quad (2)$$

$$I_{Z1} = X_1 . I_0' \quad (3)$$

A current divider circuit in accordance with the present invention has many possible applications, and many variations are possible to suit particular circumstances. For example, if it is necessary to pass a known fraction of the current I through more than one arbitrary impedance, for example, the impedance Z1 and a further impedance Z2 (shown dotted in FIG. 2), this can be done simply by providing a further output transistor 36-2 (shown dotted) in the current mirror circuit 32. This process can in principle be extended to allow for any number of arbitrary impedances Z1 to ZM. Each arbitrary impedance Zm would then be related to $I_0'$ by the equation $I_{Zm} = X_m . I_0'$, where $X_m$ is the aspect ratio of the mth output transistor of the current mirror circuit 32, relative to the aspect ratio of the input transistor 34. Formula (2) would still apply but modified so that the term $(1+X_1)$ in the denominator became $(1+X_1+\ldots X_M)$.

Alternatively, an additional arbitrary impedance (similar to Z2) could be provided for by means of a separate further p-channel transistor (similar to T0') and a separate n-channel current mirror circuit (similar to current mirror circuit 32). This might be desirable for example, if it is required to give the additional impedance a much greater or smaller share of the total current than that given to the impedance Z1.

The current mirror circuit 32 (or any separate current mirror circuit driven by a separate further transistor) can also be provided with a further output transistor 38 (shown dotted) which draws a current $I_y$ from an output 40 via an impedance Y (also shown dotted). The current $I_y$ will be related by a predetermined ratio to the currents I, $I_0'$ to $I_N'$ and $I_{Z1}$ to $I_{ZM}$, but will not be a part of the total current I drawn from the node 22. The aspect ratio of a transistor such as transistor 38 should not be included in the (1+X) term in the denominator of Formula (2). However, it is necessary to include a term corresponding to $(W/L)_0'$ for every further transistor provided, even if it drives only a separate current mirror circuit whose output current is not drawn from the node 22.

A circuit such as that shown in FIG. 2 in which N=2 and which includes the parts 38 and Y but excludes the parts 36-2 and Z2, is described in use in United Kingdom patent application No. 8810166.2 (PHB 33455) having the same priority date as the present application. That application relates to a current sensing circuit of the type disclosed in EP-Al-227 149 for use with a cellular power semiconductor device. In that application, the input 10 of a current divider according to the present invention is connected to a representative cell of a many-celled power transistor. The divider circuit acts as a whole to control the voltage on the input 10 so that it is equal to the voltage on the remainder main portion of the power transistor, which includes a much larger number of cells. This control is exerted by applying a control voltage $V_{CONT} = V_{BIAS}$ to the bias input 26 of the divider as shown in FIG. 2. Until now, it has been assumed that the voltage $V_{BIAS}$ is a constant voltage which gives rise to a 'passive' divider circuit. However, the transistors TO' to TN' act to maintain the node 22 a threshold voltage above the control voltage $V_{CONT}$ and in the current sensing circuit, the bias input 26 is driven by the output of a differential amplifier to create a divider circuit which actively controls the voltage on the input as well as dividing the current I flowing into it.

In the current sensing circuit, the terminal 40 is connected to the main portion of the power transistor and the impedance Y is a forward biased diode connected n-channel MOSFET, which provides a voltage level shifting function at the input to the differential amplifier. The impedance Z1 is matched to impedance Y to provide an equal voltage level shift in the signal applied to the other input of the differential amplifier ($I_y = I_{Z1}$). Because the divider circuit ensures that $I_1'$ and $I_2'$ are known fractions of the total current in the representative cell, and because the representative cell is maintained under the same bias as the major portion of the power transistor by the feedback action of the differential amplifier and the divider circuit, the currents $I_1$ and $I_2$ provide an accurate measure, on a very small scale, of the output current of the power transistor.

From reading the present disclosure, other modifications will be apparent to persons skilled in the art. Such modifications may involve other features which are already known in the design, manufacture and use of current divider circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly which would be obvious to persons skilled in the art, whether or not it relates to the same invention as presently claimed in any claim and whether or not it mitigates any or all of the same technical problems as does the present invention.

I claim:

1. A current divider circuit comprising; means for applying a signal current to a signal current node which divides the signal current in predetermined proportions between a plurality of current paths connected to said node, said plurality of current paths comprising at least one first current path and at least one second current path, with each said at least one first current path comprising a first type e.g. bipolars, MOS . . .; of impedance element coupled between said node and at least one respective output node, each said at least one second current path comprising a type of impedance element dissimilar (e.g. different structure bipolar, MOS . . .; different conductivity . . .) to the first type, each said at least one second current path including an output branch of a current mirror circuit, and an input branch of said current mirror circuit connected to the node via a further current path comprising an impedance element of the first type.

2. A current divider circuit as claimed in claim 1, wherein the at least one first current path and the further current path comprise main current paths of similar (e.g. same structure-bipolar, MOS . . .; same conductivity . . .) transistors having control electrodes connected to a common bias voltage received at a terminal other than said at least one respective output node so that relative geometries of the transistors define said predetermined proportions of current.

3. A current divider circuit as claimed in claim 2, wherein each similar transistor is a metal-oxide-semiconductor field-effect transistor (MOSFET), the source-drain paths of the MOSFETs forming paths of similar impedance, the source electrodes of the MOSFETs being connected to the node and the gate electrodes of the MOSFETs being connected to the common bias voltage, and the aspect ratios (W/L) of the similar MOSFETs defining said predetermined proportions of current.

4. A current divider circuit as claimed in claim 2 wherein said at least one second path comprises a plurality of second current paths wherein the current mirror circuit has a corresponding plurality of output branches.

5. A circuit for controlling the voltage at a node while dividing a signal current flowing into the node in predetermined proportions between one or more first current paths coupled to said node and including voltage control means and one or more second current paths coupled to said node and including an impedance or impedances dissimilar to that of the voltage control means, the circuit comprising a current divider circuit as claimed in claim 2, the common bias voltage forming a control signal for defining the voltage at the node.

6. A current divider circuit as claimed in claim 1 wherein said at least one second path comprises a plurality of second current paths wherein the current mirror circuit has a corresponding plurality of output branches respectively coupled to individual ones of said plurality of second current paths.

7. A current divider circuit comprising:

a signal current node which receives a signal current for division in predetermined portions between at least one first current path and at least one second current path, said at least one first current path including a first impedance means coupled between said node and a current output node, said at least one second current path including a second impedance means dissimilar (e.g. different structure-bipolar, MOS . . .; different conductivity . . .) to said first impedance means whereby the impedance of said at least one second current path is different from the impedance of said at least one first current path, said at least one second current path being coupled to said node, a further current path coupled to said node and including a further impedance means which is similar (e.g. same structure-bipolar, MOS . . .; same conductivity . . .) to said first impedance means of the first current path, and a current mirror circuit having an input branch coupled to said node via said further current path and having an at least one respective output branch included in said at least one second current path.

8. A current divider circuit as claimed in claim 7 wherein said at least one first and second current paths are electrically separated such that none of the current in said first current path flows in said output branch of the current mirror circuit.

9. A current divider circuit as claimed in claim 7 further comprising:

at least one other first current path including a first impedance means which is similar to said first impedance means of said first current path and coupled between said node and a second current output node.

10. A current divider circuit as claimed in claim 9 further comprising:

at least one other second current path coupled to said node and including an impedance means dissimilar to said first impedance means, and wherein said current mirror circuit includes at least one other output branch included in said further second current path whereby said input branch of the current mirror circuit controls currents in said output branches of the current mirror circuit.

11. A current divider circuit as claimed in claim 9 further comprising a bias terminal for supplying to said current divider circuit a common bias voltage, and wherein the impedance means of said first current paths and said further current path each comprise a similar (e.g. same structure-bipolar, MOS . . .; same conductivity . . .) transistor with each transistor having a control electrode connected to said bias terminal whereby the relative dimensions of the transistors define the currents in said first and further current paths.

12. A current divider circuit as claimed in claim 7 wherein said at least one first current path includes voltage control means and said impedance means of the at least one second current path is dissimilar to said voltage control means, wherein said at least one first current path and said at least one second current path are coupled to said node without any feedback between said at least one first current path and said at least one second current path, and a bias terminal for supplying a common bias voltage to said first and further current paths thereby to control and define the voltage at said node.

* * * * *